(12) United States Patent
Ahn et al.

(10) Patent No.: US 6,984,891 B2
(45) Date of Patent: Jan. 10, 2006

(54) METHODS FOR MAKING COPPER AND OTHER METAL INTERCONNECTIONS IN INTEGRATED CIRCUITS

(75) Inventors: Kie Y. Ahn, Chappaqua, NY (US); Leonard Forbes, Corvallis, OR (US)

(73) Assignee: Micron Technology, Inc., Boise, ID (US)

( * ) Notice: Subject to any disclaimer, the term of this patent is extended or adjusted under 35 U.S.C. 154(b) by 916 days.

(21) Appl. No.: 09/817,447

(22) Filed: Mar. 26, 2001

(65) Prior Publication Data

US 2001/0017424 A1 Aug. 30, 2001

Related U.S. Application Data

(62) Division of application No. 09/032,197, filed on Feb. 27, 1998, now Pat. No. 6,211,073.

(51) Int. Cl.
*H01L 23/52* (2006.01)
*H01L 21/4763* (2006.01)

(52) U.S. Cl. .............. 257/751; 257/761; 257/758; 257/770; 438/618; 438/622

(58) Field of Classification Search ............. 257/751, 257/758, 761, 770, 767, 763, 760; 438/618, 438/622
See application file for complete search history.

(56) References Cited

U.S. PATENT DOCUMENTS

| 2,842,438 | A | 7/1958 | Saarivirta et al. ............. 75/153 |
| 3,954,570 | A | 5/1976 | Shirk et al. ................. 204/15 |
| 4,386,116 | A | 5/1983 | Nair et al. .................. 427/99 |
| 4,423,547 | A | 1/1984 | Farrar et al. ................. 29/571 |
| 4,574,095 | A | 3/1986 | Baum et al. ............... 427/53.1 |
| 4,762,728 | A | 8/1988 | Keyser et al. ............... 427/38 |
| 4,788,082 | A | 11/1988 | Schmitt ................. 427/248.1 |
| 4,931,410 | A | 6/1990 | Tokunaga et al. ........... 437/189 |
| 4,962,058 | A | 10/1990 | Cronin et al. .............. 437/187 |
| 4,996,584 | A | 2/1991 | Young et al. ............... 357/71 |
| 5,019,531 | A | 5/1991 | Awaya et al. .............. 437/180 |
| 5,100,499 | A | 3/1992 | Douglas .................. 156/635 |
| 5,130,274 | A | 7/1992 | Harper et al. ............... 437/195 |

(Continued)

FOREIGN PATENT DOCUMENTS

| JP | 405267643 A | * 10/1993 |
| JP | 405267643 | * 10/1993 |
| JP | 07-321111 | * 8/1995 |

OTHER PUBLICATIONS

Hirao, "A Novle Copper Reflow Using Dual Wetting Layers", 1997 Symposiom on VLSI Technology Digest of Technical Papers), pp. 57–58.*

(Continued)

*Primary Examiner*—Craig A. Thompson
*Assistant Examiner*—James M. Mitchell
(74) *Attorney, Agent, or Firm*—Schwegman, Lunberg, Woessner & Kluth, P.A.

(57) ABSTRACT

A typical integrated-circuit fabrication requires interconnecting millions of microscopic transistors and resistors with aluminum wires. Yet, aluminum wires have greater electrical resistance and are less reliable than copper wires. Unfortunately, current techniques for making copper wires are time-consuming and inefficient. Accordingly, the invention provides a method of making wires or interconnects from copper or other metals. One embodiment entails forming a first diffusion barrier inside a trench using ionized-magnetron sputtering for better conformal coating of the trench, and a second diffusion barrier outside the trench using jet-vapor deposition. The jet-vapor deposition has an acute angle of incidence which prevents deposition within the trench and thus eliminates conventional etching steps that would otherwise be required to leave the trench free of this material. After formation of the two diffusion barriers, the trench is filled with metal and annealed.

37 Claims, 3 Drawing Sheets

U.S. PATENT DOCUMENTS

| | | | |
|---|---|---|---|
| 5,149,615 A | 9/1992 | Chakravorty et al. | 430/313 |
| 5,158,986 A | 10/1992 | Cha et al. | 521/82 |
| 5,173,442 A | 12/1992 | Carey | 437/173 |
| 5,240,878 A | 8/1993 | Fitzsimmons et al. | 437/187 |
| 5,243,222 A | 9/1993 | Harper et al. | 257/774 |
| 5,256,205 A | 10/1993 | Schmitt, III et al. | 118/723 |
| 5,334,356 A | 8/1994 | Baldwin et al. | 422/133 |
| 5,354,712 A | 10/1994 | Ho et al. | 437/195 |
| 5,426,330 A | 6/1995 | Joshi et al. | 257/752 |
| 5,442,237 A | 8/1995 | Hughes et al. | 257/759 |
| 5,470,789 A | 11/1995 | Misawa | 437/190 |
| 5,470,801 A | 11/1995 | Kapoor et al. | 437/238 |
| 5,476,817 A | 12/1995 | Numata | 437/195 |
| 5,506,449 A | 4/1996 | Nakano et al. | 257/758 |
| 5,529,956 A | 6/1996 | Morishita | 437/195 |
| 5,538,922 A | 7/1996 | Cooper et al. | 437/195 |
| 5,539,060 A | 7/1996 | Tsunogae et al. | 525/338 |
| 5,595,937 A * | 1/1997 | Mikagi | 437/192 |
| 5,625,232 A | 4/1997 | Numata et al. | 257/758 |
| 5,635,253 A | 6/1997 | Canaperi et al. | 427/437 |
| 5,662,788 A | 9/1997 | Sandhu et al. | 205/87 |
| 5,674,787 A | 10/1997 | Zhao et al. | 437/230 |
| 5,675,187 A | 10/1997 | Numata et al. | 257/758 |
| 5,679,608 A | 10/1997 | Cheung et al. | 437/195 |
| 5,681,441 A | 10/1997 | Svendsen et al. | 205/114 |
| 5,695,810 A | 12/1997 | Dubin et al. | 427/96 |
| 5,739,579 A | 4/1998 | Chiang et al. | 257/635 |
| 5,780,358 A | 7/1998 | Zhou | 438/645 |
| 5,785,570 A | 7/1998 | Bruni | 445/52 |
| 5,792,522 A | 8/1998 | Jin et al. | 427/575 |
| 5,801,098 A | 9/1998 | Fiordalice et al. | 438/653 |
| 5,889,295 A * | 3/1999 | Rennie et al. | 257/96 |
| 5,891,797 A | 4/1999 | Farrar | 438/619 |
| 5,891,804 A | 4/1999 | Havemann et al. | 438/674 |
| 5,893,752 A | 4/1999 | Zhang et al. | 438/687 |
| 5,897,370 A | 4/1999 | Joshi et al. | 438/632 |
| 5,911,113 A | 6/1999 | Yao et al. | 438/649 |
| 5,913,147 A | 6/1999 | Dubin et al. | 438/687 |
| 5,932,928 A | 8/1999 | Clampitt | 257/758 |
| 5,933,758 A | 8/1999 | Jain | 438/687 |
| 5,968,333 A | 10/1999 | Nogami et al. | 205/184 |
| 5,969,422 A | 10/1999 | Ting et al. | 257/762 |
| 5,972,804 A | 10/1999 | Tobin et al. | 438/786 |
| 5,976,710 A | 11/1999 | Sachdev et al. | 428/620 |
| 5,981,350 A | 11/1999 | Geusic et al. | 438/386 |
| 5,985,759 A | 11/1999 | Kim et al. | 438/653 |
| 5,994,777 A | 11/1999 | Farrar | 257/758 |
| 6,001,730 A | 12/1999 | Farkas et al. | 438/627 |
| 6,008,117 A | 12/1999 | Hong et al. | 438/629 |
| 6,030,877 A | 2/2000 | Lee et al. | 438/381 |
| 6,054,172 A | 4/2000 | Robinson et al. | 427/97 |
| 6,069,068 A | 5/2000 | Rathore et al. | 438/628 |
| 6,168,704 B1 | 1/2001 | Brown et al. | 205/118 |

OTHER PUBLICATIONS

Chakravorty, K.K., et al., "High–Density Interconnection Using Photosensitive Polyimide and Electroplated Copper Conductor Lines", *IEEE Transactions on Components, Hybrids, and Manufacturing Technology*, 13(*1*), pp. 200–206, (Mar. 1990).

*In: Kirk–Othmer Concise Encyclopedia of Chemical Technology*, Grayson, M., (ed.), John Wiley & Sons, Inc., New York, NY, p. 433–435, 926–938, (1985).

*In: Metals Handbook, 8th Edition, vol. 8*, ASM Handbook Committee, (eds.), American Society for Metals, Materials Park, OH, p. 300–302.

*In: Metals Handbook, Ninth Edition, vol. 2*, Properties and Selection: Nonferrous Alloys and Pure Metals, ASM Handbook Committee, (eds.), American Society for Metals, Metals Park, OH, 157, 395, (1989).

"Brooks Model 5964 High Performance Metal Seal Mass Flow Controller (Introduced in 1991)", *Brooks Instrument*, http://www.frco.com/brooks/semiconductor/products-li.html, 1 page, (1991).

Abe, K., et al., "Sub–half Micron Copper Interconnects Using Reflow of Sputtered Copper Films", *VLSI Multilevel Interconnection Conference*, 308–311, (Jun. 25–27, 1995).

Andricacos, P.C., "Copper On–Chip Interconnections", *The Electrochemical Society Interface*, pp. 32–37, (1999).

Anonymous, "Formation of Conductors at Variable Depths—Using Differential Photomask, Projecting Images into Insulator by Reactive Ion Etching, Selectively Filling Images with Conductor", *Research Disclosure*, Disclosure No. RD 291015, Abstract, 1 p., (Jul. 10, 1988).

Anonymous, "Improved Metallurgy for Wiring Very Large Scale Integrated Circuits", *International Technology Disclosures, 4*, Abstract, 1 page, (1986).

Bae, S., et al., "Low–Temperature Deposition Pathways to Silicon Nitride, Amorphous Silicon, Polycrystalline Silicon, and n type Amorphous Silicon Films Using a High Density Plasma System", *IEEE Conference Records—Abstracts, International Conference on Plasma Science*, p. 315, (1997).

Bai, G., et al., "Copper Interconnection Deposition Techniques and Integration", *1996 Symposium on VLSI Technology*, Digest of Technical Papers, 48–49, (1996).

Bernier, M., et al., "Laser processing of palladium for selective electroless copper plating", *SPIE, 2045*, pp. 330–337, (1994).

Bhansali, S., et al., "A novel technique for fabrication of metallic structures on polymide by selective electroless copper plating using ion implantation", *Thin Solid Films, 270*, pp. 489–492, (1995).

Bhansali, S., et al., "Selective electroless copper plating on silicon seeded by copper ion implantation", *Thin Solid Films, 253*, pp. 391–394, (1994).

Braud, E., et al., "Ultra Thin Diffusion Barriers for Cu Interconnections at The Gigabit Generation and Beyond", *VMIC Conference Proceedings*, pp. 174–179, (1996).

Cabrera, A.L., et al., "Oxidation protection for a variety of transition metals and copper via surface silicides formed with silane containing atmospheres", *J. Mater. Res., 6*(*1*), pp. 71–79, (1991).

Craig, J.D., "Polymide Coatings", *In: Packaging, Electronic Materials Handbook, vol. 1*, ASM International Handbook Committee (eds.), ASM International, Materials Park, OH, 767–772, (1989).

de Felipe, T.S., et al., "Electrical Stability and Microstructural Evolution in Thin Films of High Conductivity Copper Alloys", *IEEE*, pp. 293–295, (1999).

Ding, et al., "Copper Barrier, Seed Layer and Planerization Technologies", *VMIC Conference Proceedings*, pp. 87–92, (1997).

Dubin, V.M., et al., "Selective and Blanket Electroless Copper Deposition for Ultralarge Scale Integration", *J. Electrochem. Soc., 144*(*3*), pp. 898–908, (1997).

Dushman, S., et al., *Scientific Foundations of Vacuum Technique, 2nd Edition*, John Wiley and Sons, 1–806, (1962).

Edelstein, D., et al., "Full Copper Wiring in a Sub–0.25 micrometer CMOS ULSI Technology", *IEDM*, pp. 773–776, (1997).

Eldridge, J.M., "New Approaches for Investigating Corrosion in Thin Film Devices", *Electronic Packaging and Corrosion in Microelectronics, PRoceedings of ASM's Third Conference on Electric Packaging: Materials and Processes & Corrosion in Microelectronics*, Mpls, MN, pp. 283–285, (1987).

Ernst, et al., "Growth Model for Metal Films on Oxide Surface: Cu on ZnO (0001) –O", *Physical Review B, 47*, 13782–13796, (May 15, 1993).

Gladlfelter, W.L., et al., "Trimethylamine Complexes of Alane as Precursors for the Low–Pressure Chemical Vapor Deposition of Aluminum", *Chemistry of Materials, 1*, pp. 339–343, (1989).

Godbey, D.J., et al., "Copper Diffusion in Organic Polymer Resists and Inter–level Dielectrics", *Thin Solid Films, 308–309*, pp. 470–474, (1997).

Grimblot, J., et al., "II. Oxidation of Aluminum Films", *J. Electrochem., 129*, pp. 2369–2372, (1982).

Hattangady, S.V., et al., "Integrated processing of silicon oxynitride films by combined plasma and rapid–thermal processing", *J. Vac. Sci. Technol. A, 14(6)*, pp. 3017–3023, (1996).

Hirao, S., et al., "A Novel Copper Reflow Process Using Dual Wetting Layers", *1997 Symposium on VLSI Technology*, Digest of Technical Papers, 57–58, (1997).

Hirata, A., et al., "WSiN Diffusion Barrier Formed by ECR Plasma Nitridation for Copper Damascene Interconnection", *16th Solid State Devices and Materials*, pp. 260–261, (1998).

Holloway, K., et al., "Tantalum as a diffusion barrier between copper and silicon", *Appl. Phys. Lett., 57(17)*, pp. 1736–1738, (Oct. 1990).

Hu, C.K., et al., "Extendibility of Cu Damascene to 0.1 micrometer Wide Interconnections", *Mat. Res. Soc. Symp. Proc, 514*, pp. 287–292, (1998).

Hymes, S., et al., "Passivation of Copper by Silicide Formation in Dulute Silane", *Conference Proceedings ULSI–VII*, pp. 425–431, (1992).

Iijima, T., et al., "Microstructure and Electrical Properties of Amorphous W–Si–N Barrier Layer for Cu Interconnections", *1996 VMIC Conference*, pp. 168–173, (1996).

Izaki, M., et al., "Characterization of Transparent Zinc Oxide Films Prepared by Electrochemical Reaction", *Journal of the Electrochemical Society, 144*, 1949–1952, (Jun. 1997).

Jayaraj, K., et al., "Low Dielectric Constant Microcellular Foams", *Proceedings from the Seventh Meeting of the DuPont Symposium on Polymides in Microelectrics*, pp. 474–501, (Sep. 1996).

Jeon, Y., et al., "Low–Temperature Fabrication of Polycrystalline Silicon Thin Films by ECR Pecvd", *The Electrochemical Society Proceedings, 94 (35)*, pp. 103–114, (1995).

Jin, C., et al., "Porous Xerogel Films as Ultra–low Permittivity Dielectrics for ULSI Interconnect Applications", *Conference Proceedings ULSI XII—1997 Materials Research Society*, pp. 463–469, (1997).

Kamins, T.I., "Structure and Properties of LPCVD Silicon Films", *J. Electrochem. Soc.: Solid–State Science and Technology, 127*, pp. 686–690, (Mar. 1980).

Kang, H.K., et al., "Grain Structure and Electromigration Properties of CVD CU Metallization", *Proceedings of the 10th International VLSI Multilevel Interconnection Conference*, 223–229, (Jun. 8–9, 1993).

Keppner, H., et al., "The "Micromorph" Cell: A New Way to High–Efficiency–Low–Temperature Crystalline Silicon Thin–Film Cell Manufacturing", *Mat. Res. Soc. Symp. Proc., 452*, pp. 865–876, (1997).

Kiang, M., et al., "Pd/Si plasma immersion ion implantation for selective electrless copper plating on Sio2", *Appl. Phys. Lett., 60*, pp. 2767–2769, (1992).

Kistiakowsky, G.B., et al., "Reactions of Nitrogen Atoms. I. Oxygen and Oxides of Nitrogen", *The Journal of Chemical Physics, 27(5)*, pp. 1141–1149, (1957).

Laursen, T., et al., "Encapsulation of Copper by Nitridation of Cu–Ti Alloy/Bilayer Structures", *International Conference on Metallurgical Coatings and Thin Films*, Abstract No. H1.03, San Diego, CA, p. 309, (Apr. 1997).

Len, V., et al., "An investigation into the performance of diffusion barrier materials against copper diffusion using metal–oxide–semiconductor (MOS) capacitor structures", *Solid–State Electronics, 43*, pp. 1045–1049, (1999).

Lyman, T., et al., "Metallography, Structures and Phase Diagrams", *Metals Handbook, 8*, American Society for Metals, Metals Park, Ohio, pp. 30 & 302, (1989).

Marcadal, C., et al., "OMCVD Copper Process for Dual Damascene Metallization", *VMIC Conference*, ISMIC, pp. 93–97, (1997).

Miller, R.D., et al., "Low Dielectric Constant Polyimides and Polyimide Nanofoams", *Seventh Meeting of the DuPont Symposium on Polymides in Microelectronics*, pp. 443–473, (Sep. 1996).

Miyake, T., et al., "Atomic Hydrogen Enhanced Reflow of Copper", *Applied Physics Letters, 70*, 1239–1241, (1997).

Murarka, S.P., et al., "Copper Interconnection Schemes: Elimination of The Need of Diffusion Barrier/Adhesion Promoter by the Use of Corrosion Resistant, Low Resistivity Doped Copper", *SPIE, 2335*, pp. 80–90, (1994).

Nakao, S., et al., "Thin and Low–Resistivity Tantalum Nitride Diffusion Barrier and Giant–Grain Copper Interconnects for Advanced ULSI Metallization", *Japanese Journal of Applied Physics, 38(4B)*, pp. 262–263, (Apr. 1999).

Newboe, B., et al., "Applied Materials Announces First Barrier/Seed Layer System For Copper Interconnects", *Applied Materials*, http://www.appliedmaterials.com/newsroom/pr–00103.html, pp. 1–4, (1997).

Okamoto, Y., et al., "Magnetically Excited PLasma Oxynitridation of Si at Room Temperature", *Jpn. J. Appl. Phys., 34*, pp. L955–L957, (1995).

Palleau, J., et al., "Refractory Metal Encapsulation in Copper Wiring", *Advanced Metallization for Devices and Circuits–Science, Technology and Manufacturability, Materials Research Society Symposium Proceedings, 337*, pp. 225–231, (Apr. 1994).

Park, C.W., et al., "Activaton Energy for Electromigration in Cu Films", *Applied Physics Letters, 59(*, 175–177, (Jul. 6, 1991).

Radzimski, Z.J., et al., "Directional Copper Deposition using d–c Magnetron Self–sputtering", *J. Vac. Sci. Technol. B, 16(3)*, pp. 1102–1106, (1998).

Ramos, T., et al., "Nanoporous Silica for Dielectric Constant Less Than 2", *Conference Proceedings ULSI XII—1997 Materials Research Society*, 455–461, (1997).

Rath, J.K., et al., "Low–Temperature deposition of polycrystalline silicon thin films by hot–wire CVD", *Solar Energy Materials and Solar Cells, 48*, pp. 269–277, (1997).

Ray, S.K., et al., "Flourine–enhanced nitridation of silicon at low temperatures in a microwave plasma", *J. Appl. Phys., 70*(3), pp. 1874–1876, (1991).

Rossnagel, S.M., "Magnetron Sputter Deposition of Interconnect Applications", *Conference Proceedings, ULSI XI*, 227–232, (1996).

Rossnagel, S.M., et al., "Metal ion deposition from ionized mangetron sputtering discharge", *J. Vac. Sci. Technol. B, 12*(1), pp. 449–453, (1994).

Ryan, J.G., et al., "Copper Interconnects for Advanced Logic and DRAM", Extended Abstracts of the 1998 International Conference on Solid–State Devices and Materials, Hiroshima, pp. 258–259, (1998).

Ryu, C., et al., "Barriers for copper interconnections", *Solid State Technology*, pp. 53,54,56, (Apr. 1999).

Saarivirta, M.J., "High Conductivity Copper Rich Cu–Zr Alloys", *Transactions of the Metallurgical Society of AIME, 218*, pp. 431–437, (1960).

Senzaki, Y., "Chemical Vapor Deposition of Copper using a New Liquid Precursor with Improved Thermal Stability", *Conference Proceedings ULSI XIII, Materials Research Society*, pp. 451–455, (1998).

Shacham–Diamand, Y., "100 nm Wide Copper Lines Made by Selective Electroless Deposition", *Journal of Micromechanics and Microengineering, 1*, 66–72, (Mar. 1991).

Shacham–Diamand, Y., et al., "Copper electroless deposition technology for ultra–large–scale–integration (ULSI) metallization", *Microelectronic Engineering, 33*, pp. 47–58, (1997).

Srivatsa, A.R., et al., "Jet Vapor Deposition: an Alternative to Electrodeposition", *Surface Engineering, 11*, 75–77, (1995).

Tao, J., et al., "Electromigration Characteristics of Copper Interconnects", *IEEE Electron Devices Letters, 14*, 249–251, (May 1993).

Ting, C.H., "Methods and Needs for Low K Material Research", *Materials Research Society Symposium Proceedings, vol. 381*, Low–Dielectric Constant Materials—Synthesis and Applications in Microelectronics, Lu, T.M., et al., (eds.), San Francisco, CA, 3–17, (Apr. 17–19, 1995).

Tsukada, T., et al., "Adhesion of copper films on ABS polymers deposited in an internal magnet magnetron sputtering system", *J. Vac. Sci. Technol., 16*(2), 348–351, (1979).

Van Vlack, L.H., *Elements of Materials Science*, Addison-Wesley Publishing Co., Inc. Reading, MA, pp. 468, (1959).

Venkatesan, S., et al., "A High Performance 1.8V, 0.20 micrometer CMOS Technololgy with Copper Metalization", *IEEE*, pp. 769–772, (1997).

Vossen, J.L., et al., *Thin Film Precesses II*, Academic Press, Inc., 1–866, (1991).

Wang, K., et al., "Very Low Temperature Deposition of Polycrystalline Silicon Films with Micro–Meter–Order Grains on SiO2", *Mat. Res. Soc. Symp. Proc., 355*, pp. 581–586, (1995).

Wang, X.W., et al., "Highly Reliable Silicon Nitride Thin Films Made by Jet Vapor Deposition", *Japanese Journal of Applied Physics, 34*, 955–958, (Feb. 1995).

Winters, H.F., et al., "Influence of Surface Absorption Characteristics on Reactivity Sputtered Films Grown in the Biased and Unbiased Modes", *J. Appl. Phys., 43*(3), pp. 794–799, (1972).

Wolf, S., et al., *Silicon Processing for the VLSI Era, vol. 1—Process Technology*, Lattice Press, Sunset Beach, CA, p. 514–538, (1986).

Yeh, J.L., et al., "Selective Copper plating of Polysilicon Surface Micromachined Structures", *Solid–State Sensor and Actuator Workshop*, pp. 248–251, (1998).

Zhang, J., et al., "Investigations of photo–induced decomposition of palladium acetate for electroless copper plating", *Thin Solid Films, 318*, pp. 234–238, (1998).

* cited by examiner

METHODS FOR MAKING COPPER AND OTHER METAL INTERCONNECTIONS IN INTEGRATED CIRCUITS

This application is a Divisional of U.S. application Ser. No. 09/032,197, filed Feb. 27, 1998 now U.S. Pat. No. 6,211,073.

FIELD OF INVENTION

The present invention concerns methods of semiconductor device or integrated circuit manufacturing, particularly methods of forming interconnects from copper and other metals.

BACKGROUND OF THE INVENTION

Integrated circuits, the key components in thousands of electronic and computer products, are interconnected networks of electrical components fabricated on a common foundation, or substrate. Fabricators typically use various techniques, such as layering, doping, masking, and etching, to build thousands and even millions of microscopic resistors, transistors, and other electrical components on a silicon substrate, known as a wafer. The components are then "wired," or interconnected, together to define a specific electric circuit, such as a computer memory.

Interconnecting millions of microscopic components typically entails covering the components with an insulative layer, etching small holes in the insulative layer to expose portions of the components underneath, and digging trenches in the layer to define a wiring pattern. Then, through metallization, the holes and trenches are filled with metal to form line-like wires between the components. The wires are typically about one micron thick, or about 100 times thinner than a human hair.

Aluminum and its alloys with silicon and copper are the most common metals used for the wires, or interconnects. However, at sub-micron dimensions, that is, dimensions appreciable less than one micron, aluminum-based interconnections present not only higher electrical resistances which waste power and slows down the integrated circuit, but also poor electromigration resistance which lets the aluminum diffuse, or leach, into neighboring structures. This diffusion degrades performance of an integrated circuit, ultimately undermining its reliability. Thus, there is a need to form sub-micron interconnections from metals other than aluminum.

Copper appears, because of its lower electrical resistivity and higher electromigration resistance, to be a promising substitute for aluminum. However, conventional interconnection techniques have proven impractical for making sub-micron interconnects from copper, specifically for filling the quarter-micron-wide holes and trenches thought necessary for tomorrow's smaller, more densely-packed integrated circuits.

For example, when using the conventional metallization technique of sputtering to fill trenches with copper, copper atoms spray out widely (in comparison to the width of the trenches), stick to the sidewalls of the trenches, and then to each other, eventually building bridges, or closures, across a trench and ultimately leaving voids, or wormholes, in the resulting copper wire. Similarly, when sputter-filling small holes with copper, the resulting vias are riddled with voids. These voids not only reduce the physical integrity of the copper interconnects, but also increase their electrical resistance significantly.

One attempt at solving this problem is the Hirao technique disclosed by S. Hirao and his coworkers in their article "A Novel Copper Reflow Process Using Dual Wetting Layers" (Symposium on VLSI Technology, Digest of Technical Papers, pp. 57–58 (1997)). The Hirao technique forms a trench and two diffusion barriers, one inside the trench and the other outside the trench. The inside diffusion barrier consists of a high-wetting, titanium-tungsten, and the outside diffusion barrier consists of a low-wetting, silicon-nitride. Next, the Hirao technique conventionally sputter deposits copper over both the inside and outside diffusion barriers, and afterward executes a reflow step, which heats the copper to 450° C. for 5 minutes in a vacuum. During reflow, the copper flows off the low-wetting, outside diffusion barrier into the trench, where the high-wetting diffusion barrier, to which copper easily sticks, promotes voidless copper consolidation.

Unfortunately, the Hirao technique suffers from at least four drawbacks. First, the technique is time-consuming and inefficient, particularly during formation of the outside diffusion barrier. Forming the outside diffusion barrier entails depositing a sheet of silicon nitride on an insulative layer and then masking and etching through the barrier into the insulative layer to form the trench. This etching is especially time consuming because it must dissolve not only the silicon nitride but also the insulative layer. Second, the Hirao technique forms the inside diffusion barrier using conventional sputtering which fails to yield a lining that conforms accurately to the profile of the trench or hole, ultimately yielding a deformed copper conductor with a smaller cross-section and therefore greater resistance. Third, conventional sputtering deposits the inside barrier material both inside and outside the trench, necessitating an additional scrubbing or polishing step to remove the material outside the trench. Not only is this additional scrubbing step time consuming, but it very likely wears away some of the silicon nitride material forming the outside barrier layer, reducing its effectiveness. Fourth, to control wettability of the barrier layers, the Hirao technique describes an argon-plasma treatment, another time-consuming step that further impairs its practicality.

Accordingly, there remains a need for practical methods of making low-resistance, high-reliability copper interconnections.

SUMMARY OF THE INVENTION

To address these and other needs, the inventors have developed new methods of filling holes and trenches with copper or other desirable metals. Specifically, one embodiment of the invention entails forming a trench or hole, ionized-magnetron sputtering a first material inside the trench or hole, and then jet-vapor depositing a second material outside the trench or hole. Another step fills the trench or hole with copper or other suitable metal.

The preferred embodiment conducts the jet-vapor deposition at an acute incident angle, and uses ionized-magnetron sputtering to fill the trench or hole with copper. In addition, the preferred first material consists essentially of a high-wetting diffusion-barring material, such as tungsten (W), titanium-tungsten (TiW), or titanium nitride (TiN). The second material consists essentially of a low-wetting diffusion-barring material, such as a silicon nitride (SiN) or a zinc oxide (ZnO). Moreover, after filling the trench or hole with copper, the preferred method heats, or anneals, the copper-filled trench, thereby promoting voidless consolidation of the copper within the trench or hole.

The preferred embodiment provides at least two advantages over the Hirao and related techniques. First, in contrast to conventional magnetron sputtering, ionized-magnetron sputtering of the first material and the conductor metal forms a trench lining and a metal conductor that more accurately conforms to the trench profile, thus increasing cross-sectional area of the conductor and ultimately reducing its electrical resistance. Second, jet-vapor deposition at an acute incident angle prevents deposition of the second material into the trench or hole and therefore eliminates not only the time-consuming step of etching through the second material to form the trench or hole, but also the time-consuming step of scrubbing deposited material off areas outside the trench or hole.

DESCRIPTION OF THE PREFERRED EMBODIMENTS

The following detailed description, which references and incorporates FIGS. 1–8, describes and illustrates one or more specific embodiments of the invention. These embodiments, offered not to limit but only to exemplify and teach the invention, are shown and described in sufficient detail to enable those skilled in the art to practice the invention. Thus, where appropriate to avoid obscuring the invention, the description may omit certain information known to those of skill in the art.

Figure 1:
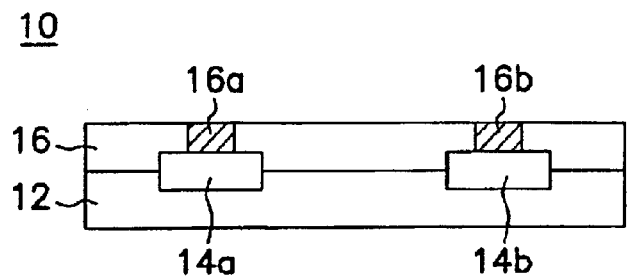
FIG. 1 is a cross-sectional view of an integrated-circuit assembly.

FIGS. 1–8 show a number of preferred integrated-circuit assemblies, which taken collectively and sequentially, illustrate the preferred method of the present invention. The method, as shown in FIG. 1, begins with a known integrated-circuit assembly or structure 10, which can be within any integrated circuit, a dynamic-random-access memory, for example. Assembly 10 includes a substrate 12. The term "substrate," as used herein, encompasses a semiconductor wafer as well as structures having one or more insulative, conductive, or semiconductive layers and materials. Thus, for example, the term embraces silicon-on-insulator, silicon-on-sapphire, and other advanced structures.

Substrate 12 supports a number of integrated elements 14, preferably transistors 14a and 14b. Transistors 14a and 14b are covered by an insulative layer 16, which preferably comprises silicon oxide, nitride, or oxynitride. Layer 16 includes two aluminum vias 16a and 16b electrically connected to respective transistors 14a and 14b. Although omitted from FIGS. 1–8 for clarity, assembly 10 preferably includes a titanium-nitride diffusion barrier between vias 16a and 16b and transistors 14a and 14b.

Figure 2A:
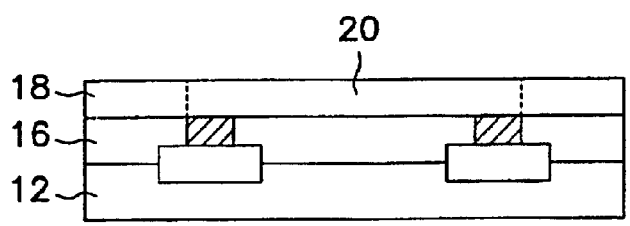
FIG. 2A is a cross-sectional view of the FIG. 1 integrated-circuit assembly after formation of an insulative layer and a trench.

The first step, exemplified in FIG. 2A, entails forming a one-micron-thick insulative layer 18 atop layer 16 and then forming a trench 20 which will ultimately define a desired conductor for connecting vias 16a and 16b. Layer 18, which preferably comprises silicon oxide, may be made using any deposition method. Trench 20 may be made using any selective-material-removal technique, although reactive-ion etching is preferred.

Figure 2B:
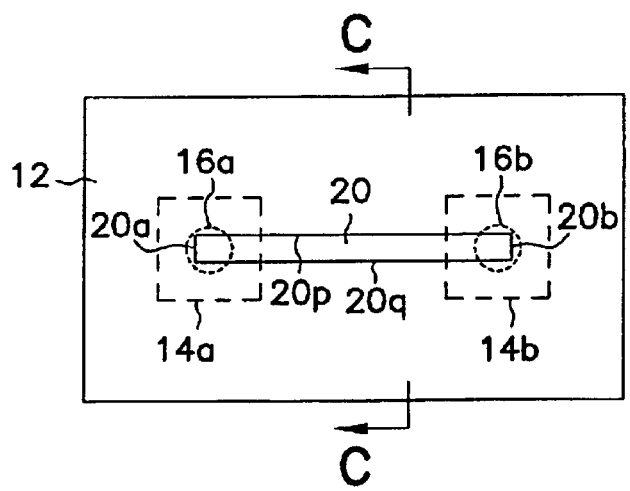
FIG. 2B is a top view of the FIG. 2A integrated-circuit assembly, showing relative position of the trench.
Figure 2C:
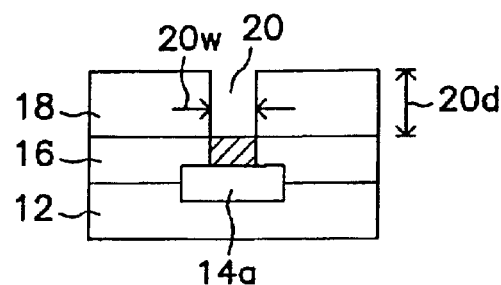
FIG. 2C is another cross-sectional view of the FIG. 2A integrated-circuit assembly, taken along line C—C to show depth and width of the trench.

FIG. 2B presents a top view of the assembly, showing the relative position of trench 20, and FIG. 2C presents a cross-section along line C—C, showing depth 20d and width 20w of trench 20. In the preferred embodiment, trench 20 is less than 0.25 microns wide and at least one micron deep. Other defining features of trench 20 include two substantially parallel longitudinal edges, or perimeter lines, 20p and 20q, which are spaced according to width 20w, and terminal edges 20a and 20b, which determine length of trench 20. The preferred embodiment places terminal edges 20a and 20b over respective vias 16a and 16b.

Figure 3:
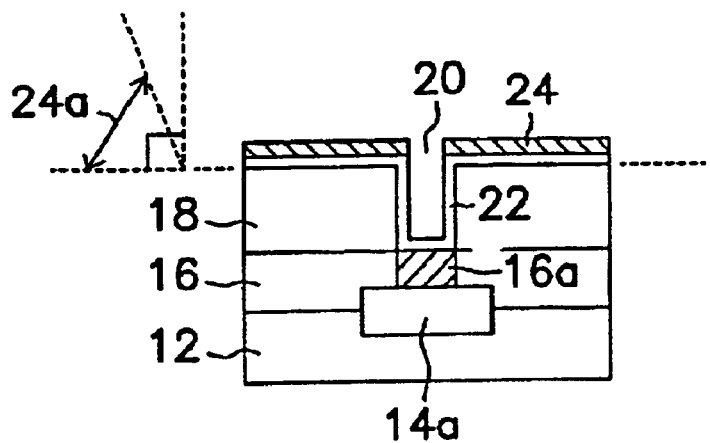
FIG. 3 is a cross-sectional view of the FIG. 2A assembly after formation of two diffusion barriers.

The next step, shown in FIG. 3, a cross-section similar to FIG. 2C, entails lining, or coating, trench 20 with an inside diffusion-barrier 22. In the preferred embodiment, diffusion barrier 22 has a uniform thickness ranging between 50 to 100 nanometers, and comprises tungsten (W), titanium-tungsten (TiW), titanium nitride (TiN), or other high-wetting copper-diffusion-barring material. To conform the inside diffusion barrier to the bottom and sidewalls of trench 22, the preferred method forms diffusion barrier 22 through ionized-magnetron sputtering. Ionized-magnetron sputtering more accurately conforms to the profile of trench 20 than conventional sputtering techniques. This ultimately increases the cross section of the desired conductor, and thus reduces its actual electrical resistance.

The next step entails coating the shoulder or external regions of trench 20 with an outside (relative trench 20) diffusion barrier 24. In the preferred embodiment, outside diffusion barrier 24 comprises a silicon nitride (SiN) or a zinc oxide (ZnO) and is approximately 50 to 100 nanometers thick. Moreover, diffusion barrier 24 has edges adjacent longitudinal edges 20p and 20q and terminal edges 20a and 20b of trench 20. In the preferred embodiment, these edges are substantially even, or flush, with the trench edges to promote optimal reflow of metal into the trench during subsequent annealing steps. In contrast to previous techniques (such as the Hirao technique described in the background) that apply a material on a layer and afterward mask and etch through the material to form a trench (or hole) bordered by the material, the preferred embodiment uses jet-vapor deposition, a high-velocity gas flow technique, to form the outside diffusion barrier after forming the trench, thereby avoiding the time-consuming step of etching through the barrier material.

To achieve this time-savings, the method changes the deposition angle of incidence from the conventional perpendicular incident angle to a glancing incident angle of approximately 86–88 degrees relative the surface plane of layer 18. This is shown as angle 24a in FIG. 3. In the preferred embodiment, the angular relationship is achieved by tilting the integrated-circuit assembly. While maintaining this relationship between the jet-vapor line of deposition and layer 18, the method rotates the integrated-circuit assembly within a horizontal plane using a rotatable substrate holder (not shown). (However, if desired, a jet-vapor output nozzle may itself be rotated about an axis of the stationary assembly.) This procedure forms diffusion barrier 24 outside and not inside trench 20.

For more information on jet-vapor deposition, refer to U.S. Pat. No. 4,788,082 to Schmitt entitled "Method and Apparatus for the Deposition of Solid Films of a Material from a Jet Stream Entraining the Gaseous Phase of said Material" and U.S. Pat. No. 5,256,205 to Schmitt, III et al. entitled "Microwave Plasma Assisted Supersonic Gas Jet Deposition of Thin Film Materials," both of which are incorporated herein by reference. An additional reference, also incorporated herein, is A. R. Srivatsa et al., "Jet Vapor Deposition: An Alternative to Electro-deposition," Institute of Materials (1994). Further information may also be obtained from the Jet Process Corporation of New Haven, Conn.

Figure 4:
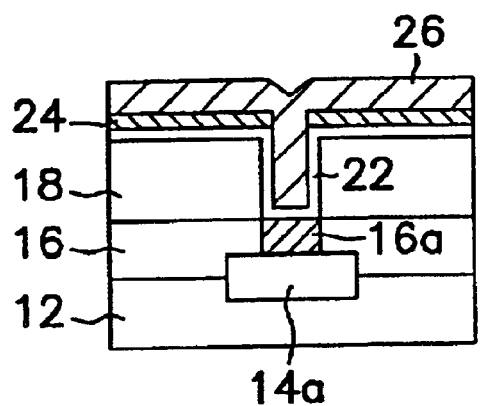
FIG. 4 is a cross-sectional view of the FIG. 3 integrated-circuit assembly after formation of a metal layer.

Next, to form a metal conductor, the method fills trench 20, as shown in FIG. 4, by depositing a metal layer 26 over the trench and surrounding areas, preferably using ionized-magnetron sputtering. For the one-micron deep trench of the preferred embodiment, a minimum 1.2-micron-thick copper layer is deposited. Preferred conditions for the ionized-magnetron sputtering operation are: target power range of 10–30 kilowatts for a 200–300 millimeter diameter wafer (or integrated-circuit assembly), RF coil power at 3–5 kilowatts, negative DC bias of 100–200 volts, sputtering argon gas pressurized at 1–35 millitorrs. Ionizedmagnetron sputtering, which provides greater acceleration of the metal deposition material than conventional sputtering, forces the metal to more closely conform to the interior profiles of holes and trenches. This, in turn, reduces the subsequent annealing time and temperature necessary to achieve an effective reflow and consolidation of the metal into a conductor.

Figure 5:
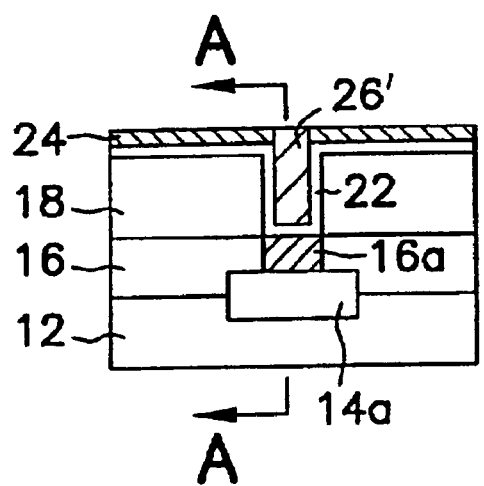
FIG. 5 is a cross-sectional view of the FIG. 4 assembly after removal of a portion of the metal layer.

Following the metal deposition is an annealing step. In the preferred embodiment, annealing proceeds for about 5 minutes at approximately 400° C. or for about 30 minutes at approximately 320° C. in a hydrogen atmosphere. For more details on annealing in hydrogen, refer to T. Miyake et al., "Atomic Hydrogen Enhanced Reflow of Copper," Applied Physics Letters, Vol. 70, 1997, which is incorporated herein by reference. The integrated-circuit assembly is then planarized by chemical-mechanical polishing (CMP) to remove metal remaining outside the trench. FIG. 5 shows resulting metal conductor 26', which electrically connects vias 16a and 16b and therefore connects transistors 14a and 14b. Formation of conductor 26' completes the first level of metallization.

Figure 6A:
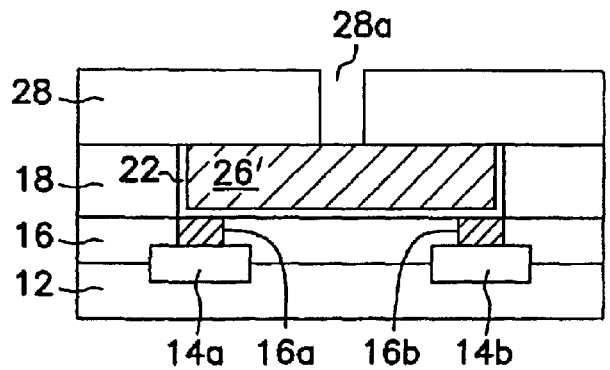
FIG. 6A is a cross-sectional view of the FIG. 5 assembly taken along line A—A after formation of an insulative layer and a via hole.
Figure 6B:
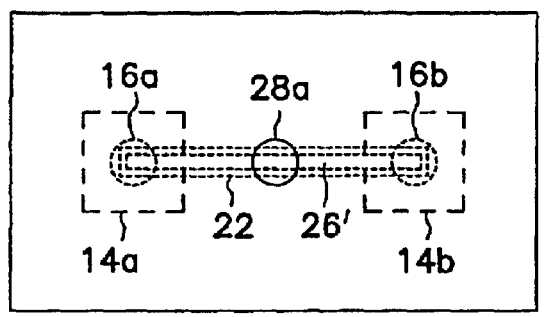
FIG. 6B is a top view of the FIG. 6A assembly, showing relative position of the via hole.
Figure 7:
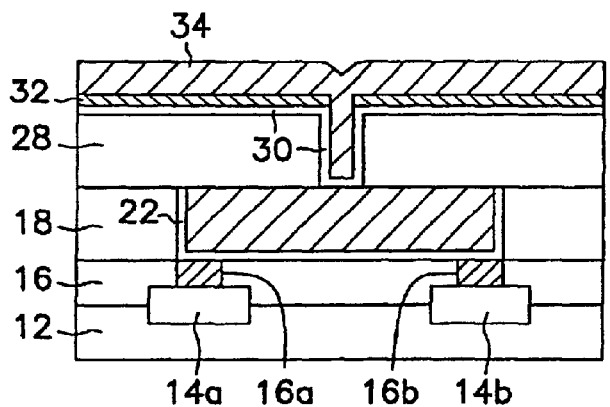
FIG. 7 is a cross-sectional view of the FIG. 6A assembly after formation of two diffusion barriers and another metal layer.

FIG. 6A, a cross-section taken along line A—A in FIG. 5, shows that the second level metallization starts with formation of a one-micron-thick dielectric layer 28 and an approximately quarter-micron-diameter (or larger) via hole 28a. (However, the invention is not limited to particular dimensions.) To enhance performance, dielectric layer 28 should have a dielectric constant as low as possible. The preferred embodiment uses a porous silicon dioxide. (For details on forming this material, see U.S. Pat. No. 5,470,801 entitled "Low Dielectric Constant Insulation Layer for Integrated Circuit Structure and Method of Making Same" which is incorporated herein by reference.) Hole 28a is preferably formed using reactive-ion etching. FIG. 6B shows the position of hole 28a relative transistors 14a and 14b, vias 16a and 16b, and conductor 26' from the first metallization level.

Figure 8:
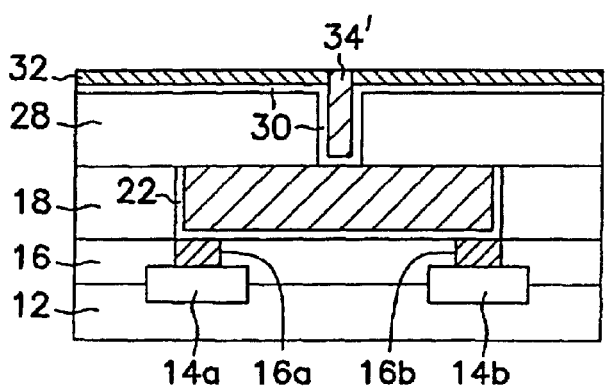
FIG. 8 is a cross-sectional view of the FIG. 7 assembly after removing a portion of the metal layer.

The next steps form an inside diffusion barrier 30 and an outside diffusion barrier 32, both according to the preferred procedures noted above for barriers 22 and 24. Accordingly, formation of inside diffusion barrier 30 entails ionized-magnetron sputtering, and formation of outside diffusion barrier entails jet-vapor deposition at an acute incident angle. Afterward, the preferred method forms a copper layer 34 over the inside and outside diffusion barriers using ionized-magnetron sputtering and then executes an annealing step. FIG. 8 shows that the resulting integrated-circuit assembly includes a copper via 34' electrically connected to underlying conductor 26' and thus also connected to transistors 14a and 14b. Subsequent metallizations would follow similarly.

With completion of the desired number of metallization levels, the preferred method ultimately concludes by heat-treating the integrated circuit for one to six hours at a temperature between 100 and 200° C. This heat treatment, which preferably occurs after packaging the integrated circuit in a protective housing, ensures that the metallic structures have minimum resistivity.

CONCLUSION

The present invention overcomes at least two significant shortcomings of previous interconnection techniques, particularly the Hirao method (described in the background.) First, instead of conventional sputtering to form an inside diffusion barriers, one embodiment of the invention uses ionized-magnetron sputtering to obtain superior sidewall coverage of small via holes and trenches and ultimately yields structures with larger cross sections and thus lower electrical resistance. Second, instead of using conventional techniques which require forming a barrier layer and then etching through it to form a trench, another embodiment uses a tilted jet-vapor deposition which prevents formation of the barrier within the trench and thus eliminates the need to etch through the barrier to form the trench. Moreover, one embodiment of the invention uses zinc oxide, instead of silicon nitride, as an outside diffusion barrier.

The embodiments described above are intended only to illustrate and teach one or more ways of practicing or implementing the present invention, not to restrict its breadth or scope. The actual scope of the invention, which encompasses all ways of practicing or implementing the invention, is defined only by the following claims and their equivalents.

What is claimed is:

1. An integrated-circuit assembly comprising:
   an insulative layer having a trench or hole, the trench or hole having an edge;
   a first diffusion barrier having a portion inside the trench or hole; and
   a second diffusion barrier on the insulative layer and having an edge substantially flush with a least a portion of the edge of the trench or hole, with the second diffusion barrier comprising a zinc oxide material and the first diffusion barrier comprising a material different than the zinc oxide material.

2. The integrated-circuit assembly of claim 1:
   wherein the assembly further comprises a metal within the trench or hole; and
   wherein the first diffusion barrier has a first wettability with the metal and the second diffusion barrier has a second wettability with the metal, the first wettability greater than the second wettability.

3. The integrated-circuit assembly of claim 1, further comprising a copper structure within the trench or hole.

4. The integrated-circuit assembly of claim 1, wherein the first diffusion barrier consists essentially of tungsten, titanium-tungsten, or titanium nitride.

5. The integrated-circuit assembly of claim 1, wherein the second diffusion barrier has no substantial portion within the trench or hole.

6. The integrated-circuit assembly of claim 1, wherein the trench or hole has an outer perimeter and wherein the second diffusion barrier includes a portion extending over the outer perimeter of the trench or hole.

7. The integrated-circuit assembly of claim 1, wherein the portion of the first diffusion barrier conforms to walls and a floor of the trench or hole.

8. The integrated-circuit assembly of claim 1, wherein the insulative layer consists essentially of a silicon oxide.

9. An integrated-circuit assembly comprising:
an insulative layer having opposing first and second major surface, with the first major surface having a trench or hole, the trench or hole having an edge;
a first diffusion barrier having an in-portion lining the trench or hole and having an out-portion outside the trench or hole and on the first major surface, with the out-portion having an edge adjacent the edge of the trench or hole;
a second diffusion barrier on the out-portion of the first diffusion barrier and having an edge substantially flush with a least a portion of the edge of the first diffusion barrier, with the second diffusion barrier comprising a zinc oxide material wherein the fist and second barriers are of different materials;
a copper conductor within the trench or hole and on the first diffusion barrier, with the second diffusion barrier having lesser wettability with copper than the first diffusion barrier.

10. The integrated-circuit assembly of claim 9, wherein the second diffusion barrier has no substantial portion within the trench or hole.

11. The integrated-circuit assembly of claim 9, wherein the insulative layer consists essentially of a silicon oxide.

12. The integrated-circuit assembly of claim 9, wherein the first diffusion barrier consists essentially of tungsten.

13. The integrated-circuit assembly of claim 9, wherein the first diffusion barrier consists essentially of titanium-tungsten.

14. The integrated-circuit assembly of claim 9, wherein the first diffusion barrier consists essentially of titanium nitride.

15. An integrated-circuit assembly comprising:
an insulative layer having opposing first and second major surface, with the first major surface having a trench or hole, the trench or hole having an edge;
a first diffusion barrier having an in-portion lining the trench or hole and having an out-portion outside the trench or hole and on the first major surface, with the out-portion having an edge adjacent the edge of the trench or hole, the first diffusion barrier consisting essentially of tungsten, titanium-tungsten, or titanium nitride;
a second diffusion barrier consisting of zinc oxide on the out-portion of the first diffusion barrier and having an edge substantially flush with a least a portion of the edge of the first diffusion barrier;
a copper conductor within the trench or hole and on the first diffusion barrier, with the second diffusion barrier having lesser wettability with copper than the first diffusion barrier.

16. The integrated-circuit assembly of claim 15, wherein the second diffusion barrier consists essentially of zinc oxide.

17. The integrated-circuit assembly of claim 15, wherein the second diffusion barrier has no substantial portion within the trench or hole.

18. The integrated-circuit assembly of claim 15, wherein the insulative layer consists essentially of a silicon oxide.

19. An integrated-circuit assembly comprising:
an insulative layer having opposing first and second major surfaces and a trench or hole in the first major surface;
a first diffusion-barrier layer having an in-portion within the trench or hole and an out-portion outside the trench or hole and on the first major surface; and
a second diffusion-barrier layer consisting of zinc oxide on the out-portion of the first diffusion-barrier layer, the second diffusion-barrier layer having no substantial portion within the trench or hole wherein the fist and second barriers are of different materials.

20. The integrated-circuit assembly of claim 19, wherein the trench or hole has an outer perimeter at the first major surface and wherein the second diffusion-barrier layer includes a portion extending over the outer perimeter of the trench or hole.

21. The integrated-circuit assembly of claim 19, wherein the first diffusion-barrier layer has a first wettability with a metal and the second diffusion-barrier layer has a second wettability with the metal, the first wettability greater than the second wettability.

22. The integrated-circuit assembly of claim 19, wherein the first diffusion-barrier layer consists essentially of a material having a first wettability with a metal, and the second diffusion-barrier layer consists essentially of a material having a second wettability with the metal, with the first wettability greater than the second wettability.

23. The integrated-circuit assembly of claim 19, wherein the first diffusion-barrier layer consists essentially of a zinc oxide material and the second diffusion barrier consists essentially of tungsten, titanium-tungsten, or titanium nitride.

24. The integrated-circuit assembly of claim 19, wherein the first diffusion-barrier layer consists essentially of a zinc oxide material.

25. The integrated-circuit assembly of claim 19, wherein the second diffusion barrier consists essentially of tungsten, titanium-tungsten, or titanium nitride.

26. The integrated-circuit assembly of claim 19, further comprising a copper structure within the trench or hole.

27. The integrated-circuit assembly of claim 19, wherein the insulative layer consists essentially of a silicon oxide.

28. The integrated-circuit assembly of claim 19, wherein the in-portion of the first diffusion-barrier layer conforms to walls and a floor of the trench or hole.

29. An integrated-circuit assembly comprising:
a silicon oxide insulative layer having opposing first and second major surfaces and a trench or hole in the first major surface;
a first diffusion-barrier layer having an in-portion within the trench or hole and an out-portion outside the trench or hole and on the first major surface;
a second diffusion-barrier layer consisting of zinc oxide on the out-portion of the first diffusion-barrier layer, the second diffusion-barrier layer having no substantial portion within the trench or hole; and a copper conductor at least partially within the trench or hole and on the first diffusion-barrier layer wherein the fist and second barriers are of different materials.

30. The integrated-circuit assembly of claim 29, wherein the in-portion of the first diffusion-barrier layer conforms to walls and a floor of the trench or hole.

31. An integrated-circuit assembly comprising:

an insulative layer having opposing first and second major surfaces and a trench or hole in the first major surface;

a first diffusion-barrier layer having an in-portion within the trench or hole and an out-portion outside the trench or hole and on the first major surface, the in-portion of the first diffusion-barrier layer conforming to walls and a floor of the trench or hole;

a second diffusion-barrier layer consisting of zinc oxide on the out-portion of the first diffusion-barrier layer, the second diffusion-barrier layer having no substantial portion within the trench or hole; and a copper conductor at least partially within the trench or hole and on the first diffusion-barrier layer wherein the fist and second barriers are of different materials.

32. The integrated-circuit assembly of claim 31, wherein the insulative layer consists essentially of silicon oxide.

33. An integrated-circuit assembly comprising:

an insulative layer having opposing first and second major surfaces and a trench or hole in the first major surface, with the trench or hole having an outer perimeter;

a first diffusion-barrier layer having an in-portion within the trench or hole and an out-portion outside the trench or hole and on the first major surface, the in-portion of the first diffusion-barrier layer conforming to walls and a floor of the trench or hole;

a second diffusion-barrier layer consisting of zinc oxide on the out-portion of the first diffusion-barrier layer, the second diffusion-barrier layer having no substantial portion within the trench or hole and having a portion extending over the outer perimeter of the trench or hole; and a copper conductor at least partially within the trench or hole and on the first diffusion-barrier layer wherein the fist and second barriers are of different materials.

34. The integrated-circuit assembly of claim 33, wherein the insulative layer consists essentially of silicon oxide.

35. An integrated-circuit assembly comprising:

an insulative layer having opposing first and second major surfaces and a trench or hole in the first major surface, with the trench or hole having an outer perimeter;

a first diffusion-barrier layer having an in-portion within the trench or hole and an out-portion outside the trench or hole and on the first major surface and consisting essentially of a material having a first wettability with a metal, with the in-portion of the first diffusion-barrier layer conforming to walls and a floor of the trench or hole;

a second diffusion-barrier layer contacting the out-portion of the first diffusion-barrier layer, consisting essentially of a material having a second wettability with the metal, having no substantial portion within the trench or hole, and having a portion extending over the outer perimeter of the trench or hole, with the second wettability less than the first wettability; and a conductor consisting essentially of copper, and being at least partially within the trench or hole and on the first diffusion-barrier layer wherein the fist diffusion barrier layer consist essentially of a zinc oxide material and the second diffusion barrier consist essentially of tungsten, titanium-tungsten, or titanium nitride.

36. The integrated-circuit assembly of claim 35, wherein the insulative layer consists essentially of silicon oxide.

37. The integrated-circuit assembly of claim 35, wherein the first diffusion-barrier layer consists essentially of a zinc oxide material.

* * * * *

UNITED STATES PATENT AND TRADEMARK OFFICE
CERTIFICATE OF CORRECTION

PATENT NO. : 6,984,891 B2
DATED : January 10, 2006
INVENTOR(S) : Ahn et al.

It is certified that error appears in the above-identified patent and that said Letters Patent is hereby corrected as shown below:

Title page,
Item [56], References Cited, OTHER PUBLICATIONS,
"Hirao" reference, delete "Novle" and insert -- Novel --; and delete "Symposiom" and insert -- Symposium --.
"Ding" reference, delete "Planerization" and insert -- Planarization --.
"Eldridge" reference, delete "PRoceedings" and insert -- Proceedings --.
"Hymes" reference, delete "Dulute" and insert -- Dilute --.
"Kiang" reference, delete "electrless" and insert -- electroless --.
"Lyman" reference, delete "30" and insert -- 300 --.
"Okamoto" reference, delete "PLasma" and insert -- Plasma --.
"Park" reference, delete "Activaton" and insert -- Activation --.
"Rossnagel" reference, delete "ionized mangetron" and insert -- ionized-magnetron --.
"Venkatesan" reference, delete "Technololgy" and insert -- Technology --; and delete "Metalization" and insert -- Metallization --.
"Vossen" reference, delete "Precesses" and insert -- Processes --.

Column 5,
Line 33, delete "Ionizedmagnetron" and insert --Ionized-magnetron --.

Column 7,
Line 33, insert -- ; -- before "wherein".
Line 33, delete "fist" and insert -- first --.

Column 8,
Line 23, insert -- ; -- before "wherein".
Line 23, delete "fist" and insert -- first --.

Column 9,
Lines 4 and 22, insert -- ; -- before "wherein".
Lines 5 and 23, delete "fist" and insert -- first --.

UNITED STATES PATENT AND TRADEMARK OFFICE
CERTIFICATE OF CORRECTION

PATENT NO. : 6,984,891 B2
DATED : January 10, 2006
INVENTOR(S) : Ahn et al.

It is certified that error appears in the above-identified patent and that said Letters Patent is hereby corrected as shown below:

Column 10,
Lines 2 and 29, insert -- ; -- before "wherein".
Lines 3 and 29, delete "fist" and insert -- first --.

Signed and Sealed this

Twenty-eighth Day of March, 2006

JON W. DUDAS
*Director of the United States Patent and Trademark Office*